United States Patent
Kawasaki (10) Patent No.: US 10,347,557 B2
(45) Date of Patent: Jul. 9, 2019

(54) WIRING BOARD, ELECTRONIC DEVICE, AND ELECTRONIC MODULE

(71) Applicant: KYOCERA Corporation, Kyoto-shi, Kyoto (JP)

(72) Inventor: Kouichi Kawasaki, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/761,977

(22) PCT Filed: Oct. 21, 2016

(86) PCT No.: PCT/JP2016/081310
§ 371 (c)(1),
(2) Date: Mar. 21, 2018

(87) PCT Pub. No.: WO2017/073486
PCT Pub. Date: May 4, 2017

(65) Prior Publication Data
US 2018/0286777 A1    Oct. 4, 2018

(30) Foreign Application Priority Data

Oct. 27, 2015  (JP) .................................. 2015-210924

(51) Int. Cl.
| | | |
|---|---|---|
| *H01L 23/34* | (2006.01) | |
| *H01L 23/36* | (2006.01) | |
| *H01L 23/12* | (2006.01) | |
| *H01L 23/498* | (2006.01) | |

(52) U.S. Cl.
CPC .............. *H01L 23/36* (2013.01); *H01L 23/12* (2013.01); *H01L 23/49811* (2013.01); *H01L 2224/16* (2013.01); *H01L 2224/16225* (2013.01); *H01L 2224/48091* (2013.01); *H01L 2224/48227* (2013.01); *H01L 2924/181* (2013.01)

(58) Field of Classification Search
CPC ... H01L 23/12; H01L 23/49811; H01L 23/13; H01L 23/15; H01L 23/52; H01L 23/522; H01L 21/4803; H01L 21/481; H01L 21/84
USPC ........ 257/678, 687, 701, 723; 438/107, 109, 438/125
See application file for complete search history.

(56) References Cited

U.S. PATENT DOCUMENTS 8,482,843 B2 *  7/2013  Uchiyama ............. B81B 3/0008
359/199.1

FOREIGN PATENT DOCUMENTS

JP    2005-191203 A    7/2005

* cited by examiner

*Primary Examiner* — Hsien Ming Lee
(74) *Attorney, Agent, or Firm* — Volpe and Koenig, P.C.

(57) ABSTRACT

The wiring board includes an insulating substrate having a main surface, an external electrode on the main surface and an outer edge portion of the insulating substrate, and a dissipating metal layer on the main surface of the insulating substrate, the dissipating metal layer having a greater area than the external electrode if viewed in a plan, the dissipating metal layer being adjacent to the external electrode and having a slit. The slit has an opening at an outer periphery of the dissipating metal layer. The external electrode faces the opening.

12 Claims, 8 Drawing Sheets

WIRING BOARD, ELECTRONIC DEVICE, AND ELECTRONIC MODULE

TECHNICAL FIELD

The present invention relates to a wiring board, an electronic device, and an electronic module.

BACKGROUND ART

A wiring board including an insulating substrate, and an external electrode and a dissipating metal layer on the main surface of the insulating substrate to be bonded to a module substrate has been known thus far. The wiring board is bonded to the module substrate with solder interposed between the external electrode and the dissipating metal layer (for example, see Japanese Patent Application Publication No. 2005-191203).

Such a wiring board may have an electrode having a slit to release gas generated if bonded with solder.

SUMMARY OF INVENTION

Technical Problem

With a recent increase in function of an electronic device, electronic components have been generating an increasing amount of heat. If the slit of the dissipating metal layer is accordingly enlarged, the dissipating metal layer would be more likely to have uneven heat-dissipation properties and the wiring board would be more likely to be warped. Thus, the dissipating metal layer may come off the insulating substrate, or the solder may come off the dissipating metal layer.

Solution to Problem

An aspect of the present invention provides a wiring board, including an insulating substrate having a main surface, an external electrode on the main surface and an outer edge portion of the insulating substrate, and a dissipating metal layer on the main surface of the insulating substrate, the dissipating metal layer having a greater area than the external electrode if viewed in a plan, the dissipating metal layer being adjacent to the external electrode and having a slit. The slit has an opening at an outer periphery of the dissipating metal layer. The external electrode faces the opening.

In an aspect of the present invention, an electronic device includes the wiring board having the above structure, and an electronic component mounted on the wiring board.

In an aspect of the present invention, an electronic module includes a module substrate including a connection pad, and the electronic device having the above structure and connected to the connection pad with solder.

Advantageous Effects of Invention

A wiring board according to an aspect of the present invention includes an insulating substrate having a main surface, an external electrode on the main surface and an outer edge portion of the insulating substrate, and a dissipating metal layer on the main surface of the insulating substrate, the dissipating metal layer having a greater area than the external electrode if viewed in a plan, the dissipating metal layer being adjacent to the external electrode and having a slit. The slit has an opening in an outer periphery of the dissipating metal layer. The external electrode faces the opening. In the above structure, the external electrode overlaps a virtually extended portion of the slit, and the external electrode is disposed near the corresponding slit, which is more likely to have low heat-dissipation properties. This structure thus efficiently transfers heat to the module substrate through the dissipating metal layer and the external electrode, and prevents uneven distribution of heat. This structure thus prevents the wiring board from being warped, and the dissipating metal layer from coming off the insulating substrate, or the solder from coming off the dissipating metal layer.

An electronic device according to an aspect of the present invention includes the wiring board having the above structure, and an electronic component mounted on the wiring board. The electronic device thus has high heat-dissipation properties and high contact reliability between itself and the module substrate.

An electronic module according to an aspect of the present invention includes a module substrate including a connection pad and the electronic device having the above structure connected to the connection pad with solder. The electronic module thus has high heat-dissipation properties, high contact reliability between the electronic device and the module substrate, and long-term reliability.

DESCRIPTION OF EMBODIMENTS

Some embodiments of the present invention are described with reference to attached drawings.

(First Embodiment)

As illustrated in FIG. 1A to FIG. 4, an electronic device according to a first embodiment of the present invention includes a wiring board 1, and an electronic component 2 on an upper surface of the wiring board 1. As illustrated in FIG.

Figure 4:
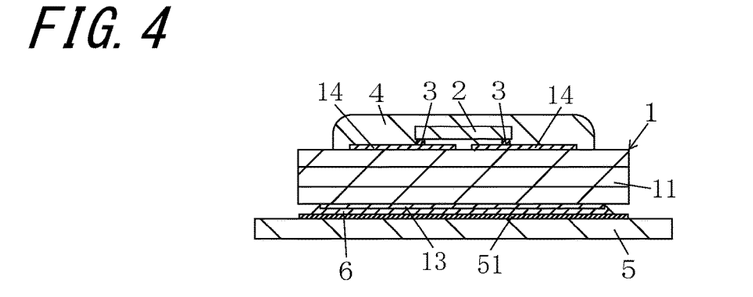
FIG. 4 is a longitudinal sectional view of an electronic module having a module substrate on which the electronic device illustrated in FIGS. 1A and 1B is mounted.

4, the electronic device is connected onto, for example, a module substrate 5, constituting an electronic module, with solder 6.

The wiring board 1 according to the present embodiment includes an insulating substrate 11, having a main surface, external electrodes 12, disposed on the main surface and at an outer edge portion of the insulating substrate 11, and a dissipating metal layer 13, disposed on the main surface of the insulating substrate 11, having a greater area than the external electrodes 12 if viewed in a plan, and being adjacent to the external electrodes 12. The wiring board 1 includes wiring conductors 14, disposed on the main surface and the inside of the insulating substrate 11. The dissipating metal layer 13 has slits 15. The slits 15 each have an opening 15a at the outer periphery of the dissipating metal layer 13. Each external electrode 12 faces the corresponding opening 15a. In FIG. 1A to FIG. 3, the wiring board 1 and the electronic device are placed in an x-y plane in a virtual xyz space. In FIG. 1A to FIG. 3, the upward direction refers to the positive direction of a virtual z-axis. The upward and downward directions in the following description are for descriptive purposes only, and do not limit the directions if the wiring board 1 and other components are actually used.

Figure 1A:
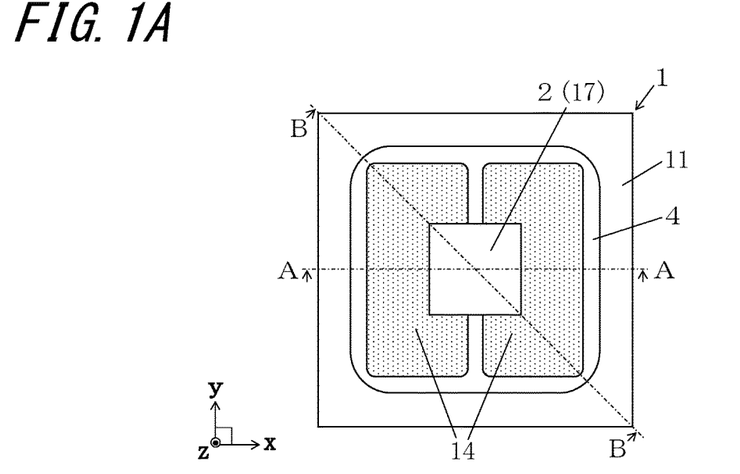
FIG. 1A is a top view of an electronic device according to a first embodiment of the present invention.

In the wiring board 1 according to the first embodiment, the wiring conductors 14 are hatched in the example illustrated in FIG. 1A. The external electrode 12 and the dissipating metal layer 13 are hatched in the example illustrated in FIG. 1B.

The insulating substrate 11 has a first main surface (lower surface in FIG. 1A to FIG. 3), a second main surface (upper surface in FIG. 1A to FIG. 3), and side surfaces. The insulating substrate 11 has an upper surface including a mount area 17 for the electronic component 2. If viewed in a plan, specifically, if viewed in a direction perpendicular to the main surface, the insulating substrate 11 has a rectangular plate shape. The insulating substrate 11 functions as a support for supporting the electronic component 2. The electronic component 2 is bonded and fixed onto the mount area 17 at a center portion of the upper surface with a bonding member, such as a low-melting point brazing filler metal or an electrically conductive resin.

The insulating substrate 11 can be made of, for example, ceramics such as sintered aluminum oxides (alumina ceramics), sintered aluminum nitrides, sintered silicon nitrides, sintered mullite, or sintered glass-ceramics. For the insulating substrate 11 formed from, for example, a sintered aluminum oxide, powdery materials such as an aluminum oxide ($Al_2O_3$), a silicon oxide ($SiO_2$), a magnesium oxide (MgO), and a calcium oxide (CaO) are mixed with a material such as an appropriate organic binder and an appropriate solvent to form slurry. The slurry is formed into a sheet by well-known doctor blading or calendaring, and forms a ceramic green sheet. The ceramic green sheet then undergoes punching as appropriate. As needed, multiple ceramic green sheets are laminated to form a green laminate, and the green laminate is fired at a high temperature (approximately 1600° C.) to form the insulating substrate 11.

The external electrodes 12 are disposed on the first main surface of the insulating substrate 11. The external electrodes 12 are bonded to the module substrate 5 with the solder 6, and electrically connect the electronic component 2 to a connection pad 51 of the module substrate 5. As illustrated in FIG. 1A to FIG. 3, for example, the external electrodes 12 are disposed at four corners of the insulating substrate 11 if viewed in a plan. Each external electrode 12 may have, for example, a circular shape or a polygonal shape such as a rectangular shape if viewed in a plan. Each external electrode 12 has a thickness of, for example, approximately 10 μm to 30 μm.

The dissipating metal layer 13 is disposed on the first main surface of the insulating substrate 11. Similarly to the external electrodes 12, the dissipating metal layer 13 is bonded to the module substrate 5 with the solder 6, and efficiently dissipates heat of the wiring board 1 to the module substrate 5. As illustrated in FIG. 1A to FIG. 3, for example, the dissipating metal layer 13 is disposed at a center portion of the first main surface of the insulating substrate 11 to overlap the electronic component 2 (mount area 17) if viewed in a perspective plan. As illustrated in FIG. 1A to FIG. 3, the dissipating metal layer 13 is adjacent to and surrounded by the multiple external electrodes 12 if viewed in a plan. The dissipating metal layer 13 may have a circular shape or a polygonal shape such as a rectangular shape if viewed in a plan. The dissipating metal layer 13 has a thickness of, for example, approximately 10 μm to 30 μm. The dissipating metal layer 13 may be connected to a component such as a grounding wiring conductor.

As illustrated in FIG. 1A to FIG. 3, for example, the dissipating metal layer 13, having a larger size than the electronic component 2 if viewed in a perspective plan, can efficiently dissipate heat of the electronic component 2 to the module substrate 5.

The wiring conductors 14 are disposed inside and on the main surface of the insulating substrate 11. The wiring conductors 14 electrically connect, in cooperation with the external electrodes 12, the electronic component 2 mounted on the wiring board 1 to the module substrate 5. The wiring conductors 14 include wiring conductors 14 disposed inside or on the surface of the insulating substrate 11, and feedthrough conductors, which extend through the insulating layers constituting the insulating substrate 11 and electrically connect the upper and lower wiring conductors together. The wiring conductors 14 on the main surface of the insulating substrate 11 have a thickness of, for example, approximately 10 μm to 30 μm.

The external electrodes 12, the dissipating metal layer 13, and the wiring conductors 14 are formed from metalizing powdery metal mainly composed of, for example, tungsten (W), molybdenum (Mo), manganese (Mn), silver (Ag), or copper (Cu). For the insulating substrate 11 formed from, for example, a sintered aluminum oxide body, powdery high-melting point metal such as W, Mo, or Mn is mixed with materials such as an appropriate organic binder and an appropriate solvent to form metalizing paste. The metalizing paste is applied in advance by screen printing to ceramic green sheets for the insulating substrate 11 into a predetermined pattern, and co-fired with the ceramic green sheets for the insulating substrate 11 to be deposited at predetermined positions of the insulating substrate 11. The external electrodes 12 and the dissipating metal layer are formed by applying metalizing paste for the external electrodes 12 or the dissipating metal layer 13 to the ceramic green sheets for the insulating substrate 11 and by co-firing the applied paste together with the ceramic green sheets for the insulating substrate 11. The wiring conductors 14 are formed by, for example, applying metalizing paste for the wiring conductors 14 to the ceramic green sheets for the insulating substrate 11 by a printing method such as screen printing and by co-firing the applied paste together with the ceramic green sheets for the insulating substrate 11. To form feedthrough conductors of the wiring conductors 14, for example, through-holes are formed in the ceramic green sheets for the insulating substrate 11 by punching using a die or by laser processing. The through-holes are then filled with metalizing paste for the feedthrough conductors by the printing method. The paste is then co-fired together with the ceramic green sheets for the insulating substrate 11. The metalizing paste is prepared by mixing the powdery metal with an appropriate solvent and an appropriate binder and kneading the mixture to have appropriate viscosity. To improve the joining strength with the insulating substrate 11, the paste may contain glass powder or ceramic powder.

The surfaces of the external electrodes 12, the dissipating metal layer 13, and the wiring conductors 14 exposed over the insulating substrate 11 are deposited with metal plating layers by electroplating or electroless plating. The metal plating layers are formed from a metal that is highly resistant to corrosion and highly connectable with a connection member, such as nickel, copper, gold, or silver. For example, a nickel plating layer with a thickness of approximately 0.5 to 5 μm and a gold plating layer with a thickness of approximately 0.1 to 3 μm, or a nickel plating layer with a thickness of approximately 1 to 10 μm and a silver plating layer with a thickness of approximately 0.1 to 1 μm are sequentially deposited on the surfaces. These plating layers effectively reduce corrosion of the external electrodes 12, the dissipating metal layer 13, and the wiring conductors 14. The plating layers strengthen fixing between the wiring conductors 14 and the electronic component 2 and connection between the wiring conductors 14 and a connection member 3, such as a bonding wire. The plating layers also strengthen connection of the external electrodes 12 and the dissipating metal layer 13 to the connection pad 51 of the module substrate 5.

Instead of the nickel/gold plating layers, the metal plating layers may be, for example, other metal plating layers including nickel/gold/silver plating layers or nickel/palladium/gold plating layers.

On the wiring conductors 14 over which the electronic component 2 is mounted, the above-described base layers formed from a nickel plating layer and a gold plating layer may be deposited with, for example, a copper plating layer with a thickness of approximately 10 to 80 μm as a metal plating layer to efficiently dissipate heat of the electronic component 2 through the copper plating layer toward the wiring board 1.

Figure 2A:
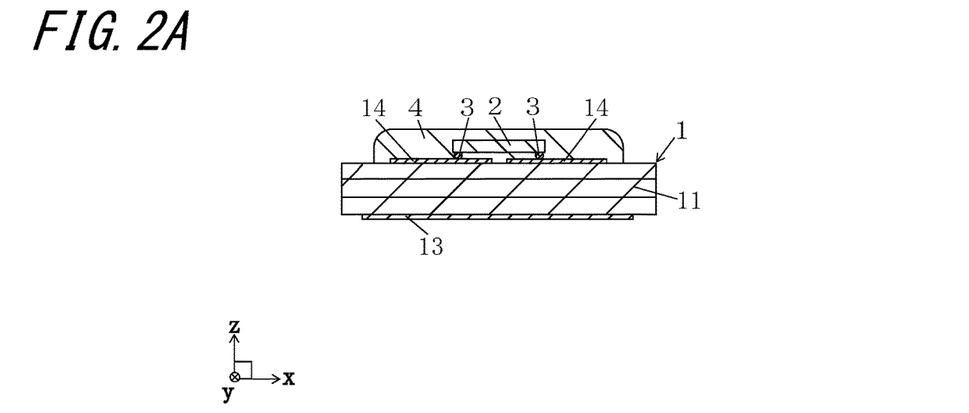
FIG. 2A is a sectional view of the electronic device illustrated in FIG. 1A, taken along line A-A.
Figure 2B:
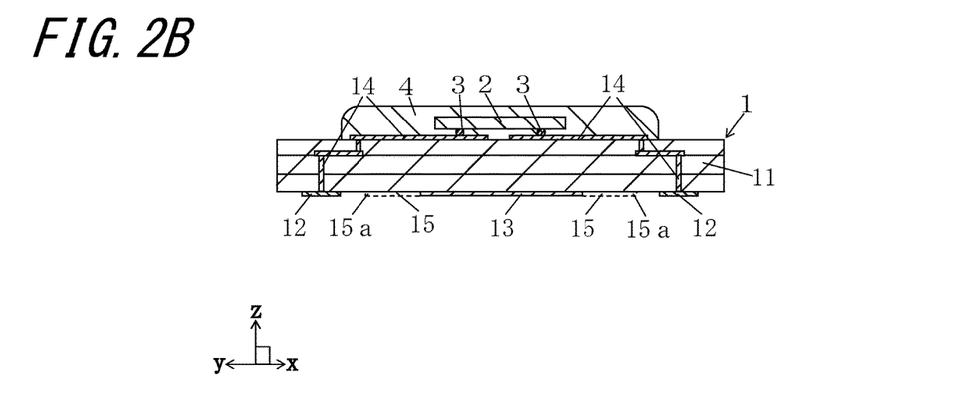
FIG. 2B is a sectional view of the electronic device, taken along line B-B.
Figure 3:
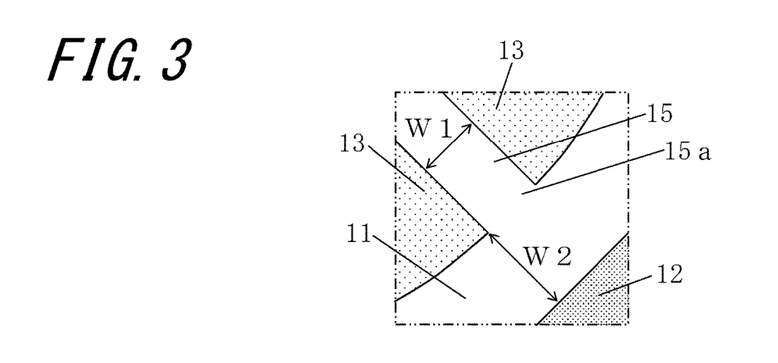
FIG. 3 is a partially enlarged bottom view of a portion C of the electronic device illustrated in FIG. 1B.

The dissipating metal layer 13 has slits 15. The slits 15 are arranged to, for example, equally divide the dissipating metal layer 13 if viewed in a plan. As illustrated in FIGS. 2A and 2B, for example, the slits 15 have openings 15a, which are open toward four corners of the rectangular insulating substrate to equally divide the dissipating metal layer 13 into four areas.

As described above, for example, the slits 15 can be formed by, for example, applying electrically conductive paste for the dissipating metal layer 13 to the ceramic green sheets for the insulating substrate 11 by screen printing to form the dissipating metal layer 13 into the pattern including the slits 15 having the openings 15a.

Alternatively, the dissipating metal layer 13 including the slits 15 having the openings 15a may be formed by forming a metal layer having a circular shape and then removing part of the metal layer by cutting, laser processing, or etching.

Here, the dissipating metal layer 13 deposited with the metal plating layer and having the slits 15 having a width of greater than or equal to 40 μm if viewed in a plan efficiently dissipates, to the outside, gas generated if the dissipating metal layer 13 and the module substrate 5 are bonded together with the solder 6. In consideration of the connection efficiency and heat-dissipation properties if the dissipating metal layer 13 and the module substrate 5 are bonded together, the width of the slits 15 is preferably smaller than or equal to 200 μm if viewed in a plan in the state where the dissipating metal layer 13 is deposited with the metal plating layer.

The slits 15 may have, for example, a shape extending inward, excluding the center of the dissipating metal layer 13, from the outer periphery of the dissipating metal layer 13 or a shape having a bent portion. However, the example illustrated in FIG. 1A to FIG. 2B is preferable because the slits 15 having a second end portion extending linearly toward the center of the dissipating metal layer 13 allow the gas generated if the dissipating metal layer 13 and the module substrate 5 are bonded together using the solder 6 to be dissipated toward the outer periphery from the center of the dissipating metal layer 13.

The slits 15 having a width larger than the thickness of the dissipating metal layer 13 if viewed in a plan are more likely to prevent gas generated from the external electrodes 12 around the openings 15a from stagnating in the slits 15.

The external electrodes 12 face the openings 15a of the slits 15. In the above structure, imaginary extensions of the slits 15 overlap the external electrodes 12. The external electrodes 12 are disposed near the slits 15, which are more likely to have low heat-dissipation properties. This structure thus efficiently transfers heat to the module substrate 5 through the dissipating metal layer 13 and the external electrodes 12, and prevents uneven distribution of heat. This structure thus prevents the wiring board 1 from being warped, and the dissipating metal layer 13 from coming off the insulating substrate 11, or the solder 6 from coming off the dissipating metal layer 13.

A gap W2 between each external electrode 12 and the corresponding slit 15, determined to be greater than or equal to the width W1 of the slit 15, enables the gas released from the slit 15 toward the external electrode 12 to be efficiently dissipated to the outside through itself between the external electrodes 12 and the dissipating metal layer 13.

Figure 1B:
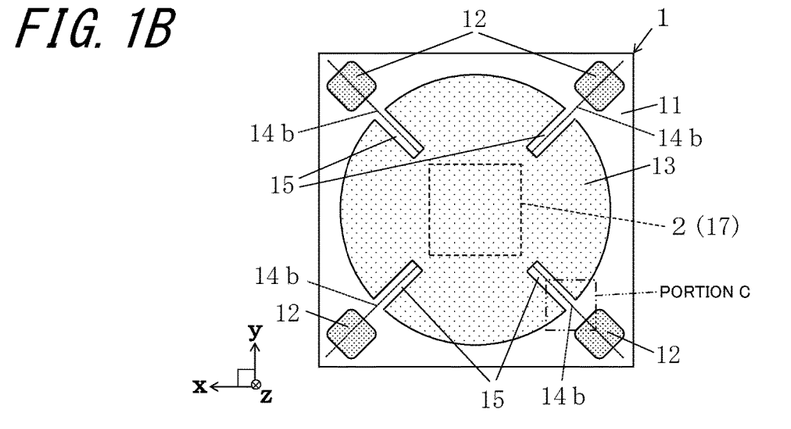
FIG. 1B is a bottom view of the electronic device illustrated in FIG. 1A.

In the example illustrated in FIGS. 1A and 1B, each external electrode 12 is rectangular, and has one side opposing the opening 15a of the corresponding slit 15. Here, each external electrode 12 can have a large area near the corresponding slit 15. This structure can effectively transfer heat to the module substrate through the dissipating metal layer 13 and the external electrodes 12, effectively prevent the heat from being unevenly distributed, and effectively prevent the wiring board 1 from being warped.

An electronic device can be formed by mounting the electronic component 2 on the upper surface of the wiring board 1. Examples of the electronic component 2 mounted on the wiring board 1 include a semiconductor device, such as an IC chip or a LSI chip, light-emitting device, a piezoelectric element, such as a quartz oscillator or a piezoelectric vibrator, and various types of sensors. For the electronic component 2 formed from, for example, a wire-bonded semiconductor device, the semiconductor device is mounted on the wiring board 1 after being fixed to the wiring conductors 14 by a bonding member, such as a low-melting point brazing filler metal or an electrically conductive resin, and then the electrodes of the semiconductor device and the wiring conductors 14 are electrically connected to each other with the connection member 3, such as a bonding wire. Thus, the electronic component 2 is electrically connected to the external electrodes 12. Alternatively, for the electronic component 2 formed from, for example, a flip-chip semiconductor device, the semiconductor device is mounted on the wiring board 1 by electrically and mechanically connecting the electrodes of the semiconductor device to the wiring conductors 14 with the connection member 3, such as a solder bump, a gold bump, or an electrically conductive resin (anisotropically electrically-conductive resin). The wiring board 1 may have multiple electronic components 2 mounted thereon or, as appropriate, have a small electronic component such as a resistor or a capacitor mounted thereon. As appropriate, the electronic component 2 may be encapsulated with an encapsulant 4, such as resin or glass, or may be sealed with a lid made of resin, glass, ceramic, or metal.

As illustrated in FIG. 4, the external electrodes 12 and the dissipating metal layer 13 of the electronic device according to the present embodiment are connected to the connection pad 51 of the module substrate 5 with the solder 6 interposed therebetween to form an electronic module. The solder is bonded to the external electrodes 12 at the outer edge portion of the insulating substrate 11, and to the dissipating metal layer 13 to cover the center portion of the lower surface of the insulating substrate 11. This structure can effectively disperse an external stress exerted on the external electrodes or the solder 6. The solder 6 obliquely spreads from the outer end of the external electrode 12 or the end of the dissipating metal layer 13 to the outer end of the connection pad 51, that is, the solder 6 forms a fillet. This structure disperses the stress on the electronic device resulting from, for example, an external force at the handling, with the effect of the solder 6 that spreads obliquely. The electronic device is thus firmly connected to the module substrate 5, and forms an electronic module having high contact reliability.

Each slit 15 has an opening 15a at its first end and is closed at its second end. As illustrated in FIG. 1B, each external electrode 12 is disposed on a virtual straight line 14b, which is an extension extending from the second end toward the first end of the corresponding slit. Thus, at least half of each external electrode 12 overlaps a virtually extended portion of the corresponding slit 15 in the width direction. Each external electrode 12 is disposed closer to the corresponding slit 15, which is more likely to have low heat-dissipation properties. This structure thus efficiently transfers heat to the module substrate 5 through the dissipating metal layer 13 and the external electrodes 12, and prevents uneven distribution of heat. This structure thus prevents the wiring board 1 from being warped, and the dissipating metal layer 13 from coming off the insulating substrate 11, or the solder 6 from coming off the dissipating metal layer 13.

As illustrated in FIGS. 2A and 2B, for the dissipating metal layer 13 having, for example, a circular shape if viewed in a plan, each slit 15 preferably has a length (distance from the first end, or the opening 15a, to the second end) of approximately ⅕ to ½ of the radius r of the dissipating metal layer 13. For the dissipating metal layer 13 having, for example, a rectangular shape if viewed in a plan and having slits extending in directions of diagonal lines of the dissipating metal layer 13, each slit 15 preferably has a length of approximately 1/10 to ¼ of the length of the diagonal lines of the dissipating metal layer 13.

Each external electrode 12 having its center portion disposed on the virtual straight line 14b is more likely to have the equivalent areas on both sides of the virtual straight line 14b, and thus is evenly disposed near the corresponding slit 15. This structure thus efficiently transfers heat to the module substrate 5 through the dissipating metal layer 13 and the external electrodes 12, and prevents uneven distribution of heat. This structure thus prevents the wiring board 1 from being warped, and thus effectively prevents the dissipating metal layer 13 from coming off the insulating substrate 11, or the solder 6 from coming off the dissipating metal layer 13.

The dissipating metal layer 13 includes multiple slits 15. The multiple slits 15 arranged point symmetric (rotational symmetric) with respect to the center of the dissipating metal layer 13 if viewed in a plan effectively prevent heat from being unevenly dispersed by the slits 15, which are more likely to have low heat-dissipation properties. This structure thus efficiently transfers heat to the module substrate 5 through the dissipating metal layer 13 and the external electrodes 12. This structure thus prevents the wiring board 1 from being warped, and the dissipating metal layer 13 from coming off the insulating substrate 11, or the solder 6 from coming off the dissipating metal layer 13.

As illustrated in FIG. 1B, the wiring board 1 includes the multiple external electrodes 12. The multiple external electrodes 12 arranged point symmetric (rotational symmetric) with respect to the center of the dissipating metal layer 13 if viewed in a plan effectively prevent heat from being unevenly dispersed by the slits 15, which are more likely to have low heat-dissipation properties. The external electrodes 12 are disposed near the slits 15. This structure thus efficiently transfers heat to the module substrate 5 through the dissipating metal layer 13 and the external electrodes 12, and effectively prevents uneven distribution of heat. This structure thus prevents the wiring board 1 from being warped, and thus effectively prevents the dissipating metal layer 13 from coming off the insulating substrate 11, or the solder 6 from coming off the dissipating metal layer 13.

The dissipating metal layer 13 having a larger thickness than the external electrodes 12 has the slits 15, serving as gas flow paths and having a large longitudinally sectional area. The dissipating metal layer 13 thus can efficiently release the gas and can efficiently dissipate heat from the dissipating metal layer 13 to the module substrate 5.

The structure having slits 15 disposed not to overlap the mount area 17 for the electronic component 2 if viewed in a perspective plan efficiently transfers the heat of the wiring board 1 from the dissipating metal layer 13 to the module substrate 5. This structure thus prevents the wiring board 1 from being warped, and the dissipating metal layer 13 from coming off the insulating substrate 11, or the solder 6 from coming off the dissipating metal layer 13.

The wiring board 1 according to the first embodiment includes the insulating substrate 11 having a main surface, the external electrodes 12 disposed at the main surface and the outer edge portion of the insulating substrate 11, and the dissipating metal layer 13 on the main surface of the insulating substrate 11, the dissipating metal layer 13 having a greater area than the external electrodes 12 if viewed in a plan, the dissipating metal layer 13 being adjacent to the external electrodes 12 and having the slits 15. Each slit 15 has the opening 15a in the outer periphery of the dissipating metal layer 13. Each external electrode 12 faces the corresponding opening 15a. Thus, each external electrode 12 overlaps a virtually extended portion of the corresponding slit 15. The external electrodes 12 are disposed near the slits 15, which are more likely to have low heat-dissipation properties. This structure thus efficiently transfers heat to the module substrate 5 through the dissipating metal layer 13 and the external electrodes 12, and prevents uneven distribution of heat. This structure thus prevents the wiring board 1 from being warped, and the dissipating metal layer 13 from coming off the insulating substrate 11, or the solder 6 from coming off the dissipating metal layer 13.

An electronic device according to an aspect of the present invention includes the wiring board 1 having the above structure, and the electronic component 2 mounted on the wiring board 1. The electronic device thus has high heat-dissipation properties and high contact reliability between itself and the module substrate 5.

An electronic module according to an aspect of the present invention includes the module substrate 5 including the connection pad 51, and the electronic device having the above structure and connected to the connection pad 51 with the solder 6. The electronic module thus has high heat-dissipation properties, high contact reliability between the electronic device and the module substrate 5, and long-term reliability.

The wiring board 1 according to the present embodiment is preferably usable in a small-sized high-power electronic device, and has reliable electric connection. The wiring board 1 is preferably usable as, for example, a small wiring board 1 for mounting a highly efficient light-emitting device as an example of the electronic component 2.

(Second Embodiment)

Figure 5A:
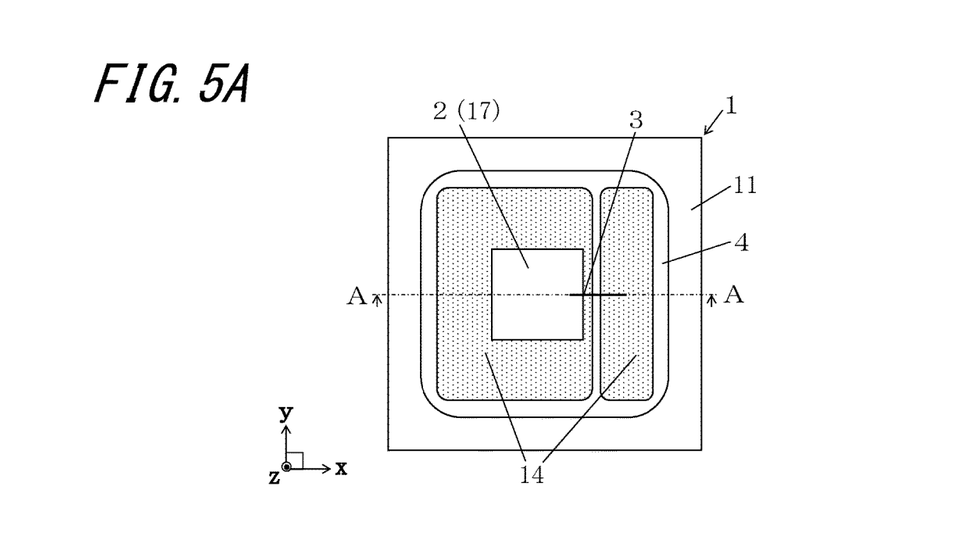
FIG. 5A is a top view of an electronic device according to a second embodiment of the present invention.
Figure 5B:
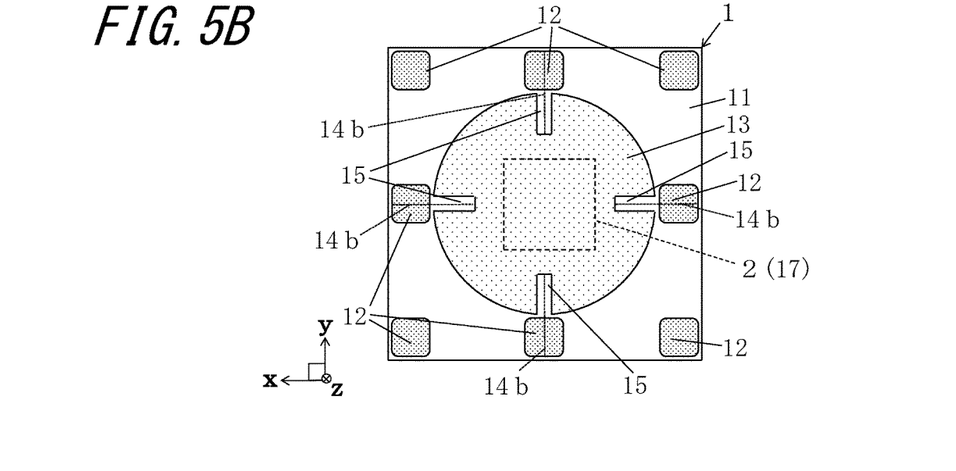
FIG. 5B is a bottom view of the electronic device illustrated in FIG. 5A.
Figure 6:
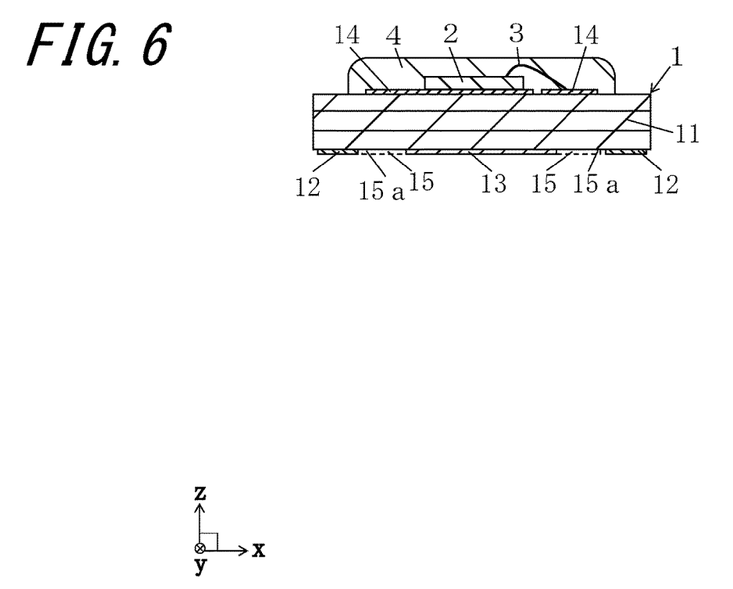
FIG. 6 is a sectional view of the electronic device illustrated in FIG. 5A, taken along line A-A.

With reference to FIG. 5A to FIG. 6, an electronic device according to a second embodiment of the present invention is described below.

The electronic device according to the second embodiment of the present invention differs from the electronic device according to the first embodiment in that the external electrodes 12 are also disposed at middle portions of the four sides of the rectangular insulating substrate 11. The slits 15 have their openings 15a open toward the four sides of the rectangular insulating substrate 11.

In the example illustrated in FIG. 5A, the wiring conductors 14 in the wiring board 1 according to the second embodiment are hatched, as in the wiring board 1 according to the first embodiment. In the example illustrated in FIG. 5B, the external electrodes 12 and the dissipating metal layer 13 are hatched, as in the wiring board 1 according to the first embodiment.

As in the wiring board 1 according to the first embodiment, in the wiring board 1 according to the second embodiment of the present invention, the external electrodes 12 are disposed near the slits 15, which are more likely to have low heat-dissipation properties. This structure thus efficiently transfers heat to the module substrate 5 through the dissipating metal layer 13 and the external electrodes 12, and prevents uneven distribution of heat. This structure thus prevents the wiring board 1 from being warped, and the dissipating metal layer 13 from coming off the insulating substrate 11, or the solder 6 from coming off the dissipating metal layer 13.

As illustrated in FIG. 5B, the external electrodes 12 may be disposed at portions other than the portions facing the openings 15a of the slits 15.

As illustrated in FIG. 5B, for the dissipating metal layer 13 having, for example, a circular shape if viewed in a plan, each slit 15 preferably has a length (distance from the first end, or the opening 15a, to the second end) of approximately ⅕ to ½ of the radius r of the dissipating metal layer 13, as in the first embodiment. For the dissipating metal layer 13 having, for example, a rectangular shape if viewed in a plan and having slits extending toward opposing sides of the dissipating metal layer 13, each slit 15 preferably has a length of approximately 1/10 to ¼ of the length of each side of the dissipating metal layer 13.

In the wiring board 1 according to the second embodiment, unlike in the wiring board 1 according to the first embodiment, the external electrodes 12 are disposed at the middle portions of the sides of the rectangular insulating substrate 11. This structure thus has a smaller gap between the opening 15a of each slit 15 and the corresponding external electrode 12 disposed at the outer edge portion of the insulating substrate 11 to face the opening 15a. The heat transfer from the external electrodes thus more efficiently prevents reduction of the heat-dissipation properties at the slits 15, and this structure prevents uneven distribution of heat. This structure thus prevents the wiring board 1 from being warped, and the dissipating metal layer 13 from coming off the insulating substrate, or the solder 6 from coming off the dissipating metal layer 13.

The wiring board 1 according to the second embodiment can be manufactured by a method similar to the above-described method for manufacturing the wiring board 1 according to the first embodiment.

(Third Embodiment)

Figure 7:
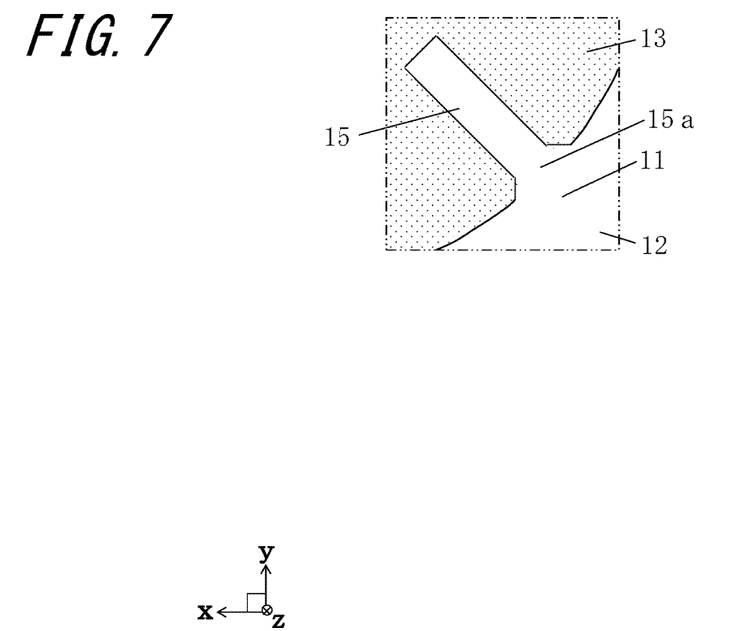
FIG. 7 is an enlarged bottom view of a portion of an electronic device according to a third embodiment of the present invention.

With reference to FIG. 7, an electronic device according to a third embodiment of the present invention is described.

The electronic device according to the third embodiment of the present invention differs from the electronic device according to the first embodiment in that each slit 15 has a larger width at the first end of the dissipating metal layer 13 than at the second end of the dissipating metal layer 13, in other words, the slit 15 has an end at the outer edge portion of the dissipating metal layer 13 having a larger width than at an inner end.

In the example illustrated in FIG. 7, the dissipating metal layer 13 in the wiring board 1 according to the third embodiment is hatched, as in the wiring board 1 according to the first embodiment.

In the wiring board 1 according to the third embodiment, each slit 15 has a larger width at the first end of the dissipating metal layer 13 than at the second end of the dissipating metal layer 13. This structure can efficiently dissipate gas from the center of the dissipating metal layer 13 toward the outer periphery. In addition, the dissipating metal layer 13 has a larger area at the center than if the width is increased throughout the entirety of the slits 15 from the first end to the second end. This structure thus has high contact properties between the dissipating metal layer 13 and the module substrate 5 with the solder 6, and high heat-dissipation properties from the wiring board 1 to the module substrate 5.

Each slit 15 has its width increasing stepwise or partially from the second end to the first end or has its width gradually increasing from the second end of the dissipating metal layer 13 to the first end. Thus, the slit 15 can have a larger width at the first end of the dissipating metal layer 13 than at the second end of the dissipating metal layer 13. The slit 15 having its width gradually increasing from the second end of the dissipating metal layer 13 to the first end of the dissipating metal layer 13 allows the gas generated from the solder 6 if the dissipating metal layer 13 are bonded to the module substrate 5 with the solder 6 to be smoothly released to the outside. This structure can thus prevent voids from being formed in the solder 6.

The dissipating metal layer 13 and the slits 15 according to the third embodiment are formed by a method similar to that of the first embodiment. If the dissipating metal layer 13 and the slits 15 are formed by, for example, applying electrically conductive paste for the dissipating metal layer 13 to the ceramic green sheets for the insulating substrate 11 by screen printing, the dissipating metal layer 13 is formed into a pattern in which each slit 15 has a larger width at the first end of the dissipating metal layer 13 than at the second end of the dissipating metal layer 13.

The slits 15 having a large width in an area outside of the electronic component 2 if viewed in a perspective plan can efficiently release the gas while the electronic device retains heat-dissipation properties.

As in the first embodiment, the wiring board 1 according to the third embodiment is preferably usable in a small-sized high-power electronic device, and has reliable electric connection. The wiring board 1 is preferably usable as, for example, a small wiring board 1 for mounting a highly efficient light-emitting device as an example of the electronic component 2.

The wiring board 1 according to the third embodiment can be manufactured by a method similar to the method for manufacturing the wiring board 1 according to the first embodiment.

(Fourth Embodiment)

Figure 8:
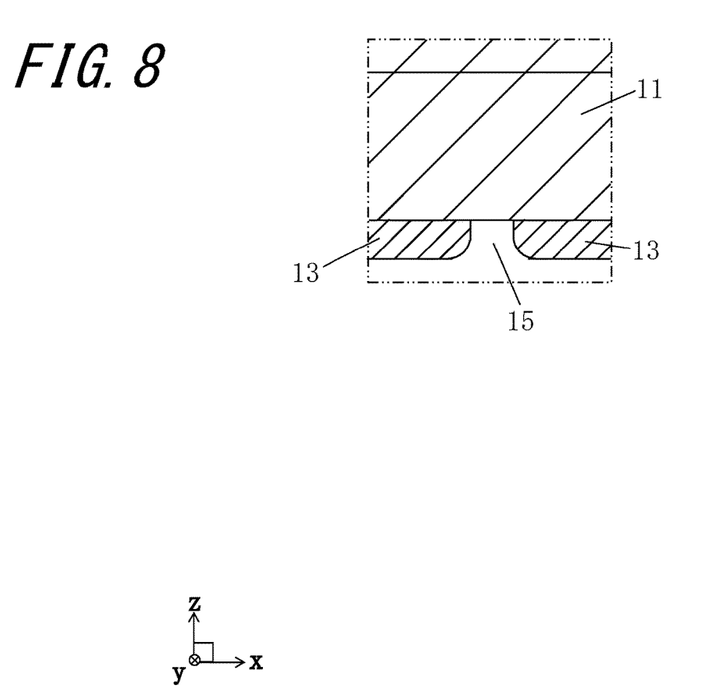
FIG. 8 is an enlarged, longitudinal sectional view of a portion of an electronic device according to a fourth embodiment of the present invention.

With reference to FIG. 8, an electronic device according to a fourth embodiment of the present invention is described below.

The wiring board 1 according to the fourth embodiment of the present invention differs from the wiring board 1 according to each of the above embodiments in that, as in the example illustrated in FIG. 8, each slit 15 has a larger width at a portion closer to the outer surface (lower surface) of the dissipating metal layer 13 than at a portion near the insulating substrate 11, if viewed in a cross section.

In the wiring board 1 according to the fourth embodiment, each slit 15 has a larger width at a portion closer to the outer surface (lower surface) of the dissipating metal layer 13 than at a portion near the insulating substrate 11, if viewed in a cross section. This structure includes the slits 15, serving as gas flow paths and having a large longitudinally sectional area, and thus can efficiently release the gas and prevent voids from being formed in the solder 6.

As in the first embodiment, the wiring board 1 according to the fourth embodiment is preferably usable in a small-sized high-power electronic device, and has reliable electric connection. The wiring board 1 is preferably usable as, for example, a small wiring board 1 for mounting a highly efficient light-emitting device as an example of the electronic component 2.

The wiring board 1 according to the fourth embodiment can be manufactured by a method similar to the method for manufacturing the wiring board 1 according to the first embodiment. If the dissipating metal layer 13 and the slits 15 are formed by, for example, applying electrically conductive paste for the dissipating metal layer 13 to the ceramic green sheets for the insulating substrate 11 by screen printing, the dissipating metal layer 13 is formed into a pattern in which each slit 15 has a larger width at a portion near the lower surface of the slit 15 than at a portion near the insulating substrate 11 if viewed in a cross section.

(Fifth Embodiment)

Figure 9A:
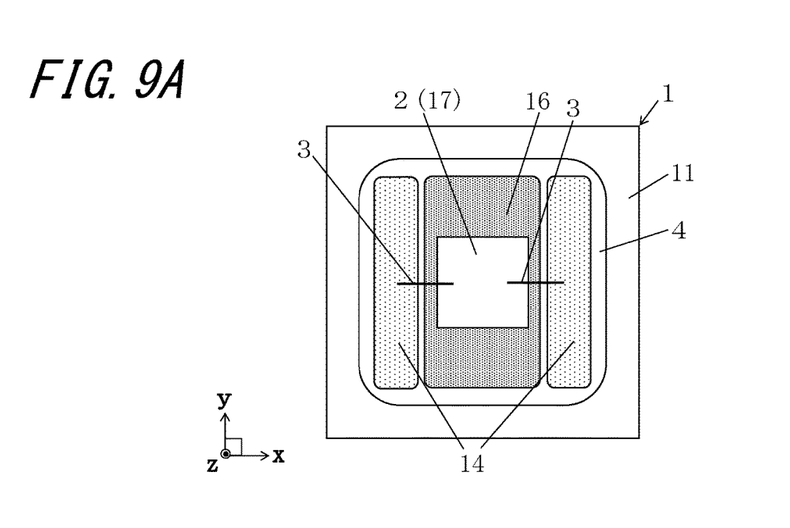
FIG. 9A is a top view of an electronic device according to a fifth embodiment of the present invention.
Figure 9B:
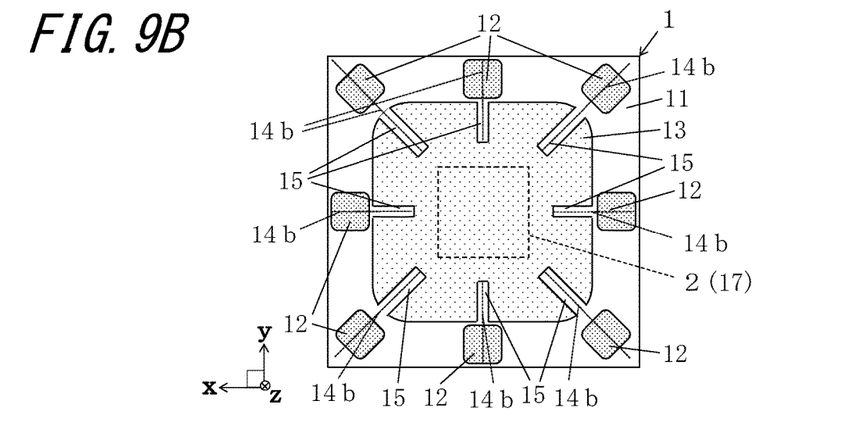
FIG. 9B is a bottom view of the electronic device illustrated in FIG. 9A.

With reference to FIGS. 9A and 9B, an electronic device according to a fifth embodiment of the present invention is described below.

The electronic device according to the fifth embodiment of the present invention differs from the electronic device according to the first embodiment in that the openings 15*a* of the slits 15 are disposed on four sides and at four corners of a rectangular insulating substrate 11, and the external electrodes are disposed on four sides and at four corners of the insulating substrate 11, facing the respective openings 15*a* of the slits 15.

As in the wiring board 1 according to the first embodiment, the wiring conductors 14 of the wiring board 1 according to the fifth embodiment are hatched in the example illustrated in FIG. 9A. As in the wiring board 1 according to the first embodiment, the external electrodes 12 and the dissipating metal layer 13 are hatched in the example illustrated in FIG. 9B.

As in the wiring board 1 according to the first embodiment, in the wiring board 1 according to the fifth embodiment of the present invention, this structure efficiently transfers heat to the module substrate 5 near the slits 15, which are more likely to have low dissipation properties, and prevents uneven distribution of heat. This structure thus prevents the wiring board 1 from being warped, and the dissipating metal layer 13 from coming off the insulating substrate 11, or the solder 6 from coming off the dissipating metal layer 13.

As illustrated in FIG. 9B, the slits 15 may have different lengths and widths. For example, the slits 15 having their openings 15*a* at four corners of the rectangular insulating substrate 11 may have a larger length or larger width than the slits 15 having their openings 15*a* on four sides of the rectangular insulating substrate 11. This structure may accordingly reduce the width of the slits 15 in a highly heat conductive area near the electronic component 2, facilitate heat transfer from the dissipating metal layer 13 to the module substrate 5, and allow the gas to be released toward the four corners of the insulating substrate 11.

As in the first embodiment, the wiring board 1 according to the fifth embodiment is preferably usable in a small-sized high-power electronic device, and has reliable electric connection. The wiring board 1 is preferably usable as, for example, a small wiring board 1 for mounting a highly efficient light-emitting device as an example of the electronic component 2.

The wiring board 1 according to the fifth embodiment can be manufactured by a method similar to the method for manufacturing the wiring board 1 according to the first embodiment.

The present disclosure is not limited to the above-described embodiments and can be modified in various different manners. For example, the external electrodes 12 are arranged on the first main surface of the insulating substrate 11. However, the insulating substrate 11 may have a hole connecting the side surface and the first main surface, and the inner surface of the hole may have one external electrode 12 extended thereto, and forms a so-called castellation conductor.

As in the wiring board 1 according to the second embodiment, in the wiring board 1 according to the first embodiment, the external electrodes 12 may be disposed at portions other than the portions facing the openings 15*a* of the slits 15.

As illustrated in FIG. 5B or FIG. 9B, the wiring board 1 according to the second embodiment or the wiring board 1 according to the fifth embodiment includes one slit 15 and one external electrode 12 on each side of the rectangular insulating substrate 11. However, the wiring board 1 may include multiple slits 15 and multiple external electrodes 12 on each side of the rectangular insulating substrate 11.

The structure of the slits 15 of the wiring board 1 according to the third embodiment or the structure of the slits 15 of the wiring board 1 according to the fourth embodiment may be applied to the slits 15 of the wiring board 1 according to the first embodiment, the second embodiment, or the fifth embodiment. The slits 15 may have characteristics of the slits 15 of the wiring board 1 according to the third embodiment and the slits 15 of the wiring board 1 according to the fourth embodiment.

As in the external electrodes 12 and the wiring conductors 14, the dissipating metal layer 13 may be used as an electrode for electrically connecting the electronic component 2 mounted on the wiring board 1 to the module substrate 5. Here, for example, the dissipating metal layer 13 may be electrically connected to one of the external electrodes 12 through the wiring conductors 14.

In the wiring board 1, a metal member having higher thermal conductivity than the insulating substrate 11 may be embedded in the insulating substrate 11 in, if viewed in a plan, an area in which the electronic component 2 is mounted and in an area that overlaps the dissipating metal layer 13.

As illustrated in FIGS. 9A and 9B, the wiring board 1 may also include conductors other than wires, including an electronic component receiving layer 16 disposed between the wiring conductors 14. The electronic component receiving layer is hatched in the example illustrated in FIG. 9A. For example, these conductors can be formed from the same material and manufactured by the same method as those of the external electrodes 12, the dissipating metal layer 13, and the wiring conductors 14. The exposed surfaces of these conductors are deposited with a metal plating layer similar to that for the external electrodes 12, the dissipating metal layer 13, and the wiring conductors 14. The electronic component receiving layer 16 is used to allow, for example, the electronic component 2 to be mounted thereon.

The wiring board 1 according to each of the first to fifth embodiments has a flat plate shape. Alternatively, the wiring board 1 may have a cavity in the second main surface to hold the electronic component 2.

In the above examples, the wiring board 1 has one electronic component 2 mounted thereon. However, the wiring board 1 may be, for example, a wiring board 1 for mounting multiple electronic components 2, such as multiple light-emitting devices. Here, if viewed in a perspective plan, the dissipating metal layer 13 preferably overlaps the mount areas for the multiple electronic components 2 and has a larger size than the mount areas of the multiple electronic components 2.

The wiring board 1 may be one of multiple wiring boards concurrently manufactured from a single form.

The invention claimed is:

1. A wiring board comprising:
an insulating substrate comprising a main surface;
a dissipating metal layer on the main surface of the insulating substrate
a first slit formed on the dissipating metal layer, wherein the first slit comprises an opening at a first end of the first slit along an outer periphery of the dissipating metal layer and a second end of the first slit that is closed; and
a first external electrode that faces the opening, is formed on the main surface and an outer edge portion of the insulating substrate and is disposed on a virtual straight line extended from the second end through the first end, wherein the dissipating metal layer is adjacent to the first external electrode and comprises a greater area than the first external electrode when viewed in a plan view.

2. The wiring board according to claim 1, wherein the first external electrode comprises a center portion on the virtual straight line.

3. The wiring board according to claim 2, wherein the first external electrode is rectangular, and wherein the first external electrode comprises a side facing the opening of the first slit.

4. The wiring board according to claim 3, wherein the dissipating metal layer comprises a plurality of slits that includes the first slit, and wherein the plurality of slits is arranged to be point symmetric with respect to a center portion of the dissipating metal layer if viewed in the plan view.

5. The wiring board according to claim 2, wherein the dissipating metal layer comprises a plurality of slits that includes the first slit, and wherein the plurality of slits is arranged to be point symmetric with respect to a center portion of the dissipating metal layer if viewed in the plan view.

6. The wiring board according to claim 1, wherein the first external electrode is rectangular, and wherein the first external electrode comprises a side facing the opening of the first slit.

7. The wiring board according to claim 6, wherein the dissipating metal layer comprises a plurality of slits that includes the first slit, and wherein the plurality of slits is arranged to be point symmetric with respect to a center portion of the dissipating metal layer if viewed in the plan view.

8. The wiring board according to claim 1, wherein the dissipating metal layer comprises a plurality of slits that includes the first slit, and wherein the plurality of slits is arranged to be point symmetric with respect to a center portion of the dissipating metal layer if viewed in the plan view.

9. The wiring board according to claim 8, comprising a plurality of external electrodes that include the first external electrode, wherein the plurality of external electrodes is arranged to be point symmetric with respect to the center portion of the dissipating metal layer if viewed in the plan view.

10. The wiring board according to claim 1, wherein the insulating substrate comprises a mount area for an electronic component, and wherein the first slit is arranged not to overlap the mount area if viewed in a perspective plan view.

11. An electronic device, comprising:
the wiring board according to claim 1; and
an electronic component mounted on the wiring board.

12. An electronic module, comprising:
a module substrate comprising a connection pad; and
the electronic device according to claim 11 connected to the connection pad with solder.

* * * * *